United States Patent
Casti

(10) Patent No.: US 8,934,524 B2
(45) Date of Patent: Jan. 13, 2015

(54) METHOD FOR DETECTING WITH A HIGH TEMPORAL ACCURACY A THRESHOLD CROSSING INSTANT BY A SIGNAL

(71) Applicant: Thales Italia S.p.A., Milan (IT)

(72) Inventor: Maurizio Casti, Milan (IT)

( * ) Notice: Subject to any disclaimer, the term of this patent is extended or adjusted under 35 U.S.C. 154(b) by 137 days.

(21) Appl. No.: 13/741,032

(22) Filed: Jan. 14, 2013

(65) Prior Publication Data

US 2013/0128939 A1  May 23, 2013

Related U.S. Application Data

(63) Continuation of application No. 13/490,306, filed on Jun. 6, 2012, now abandoned.

(30) Foreign Application Priority Data

Jun. 6, 2011 (EP) ..................................... 11425151

(51) Int. Cl.
| | |
|---|---|
| H04B 3/46 | (2006.01) |
| H04B 17/00 | (2006.01) |
| H03K 5/08 | (2006.01) |
| H03K 5/1534 | (2006.01) |

(52) U.S. Cl.
CPC .................. H04B 17/00 (2013.01); H03K 5/08 (2013.01); H03K 5/1534 (2013.01)
USPC ........... 375/224; 375/316; 375/332; 375/340; 375/354; 375/355; 375/371; 702/66; 702/74; 702/79; 702/176; 702/193

(58) Field of Classification Search
USPC ......... 375/316, 332, 340, 341, 346, 349, 354, 375/355, 371; 702/66, 74, 79, 176, 193
See application file for complete search history.

(56) References Cited

U.S. PATENT DOCUMENTS

| | | | | |
|---|---|---|---|---|
| 5,266,953 A | * | 11/1993 | Kelly et al. | 342/47 |
| 5,790,480 A | | 8/1998 | Klatser | |
| 6,081,484 A | | 6/2000 | West | |
| 7,082,172 B1 | * | 7/2006 | Pringle et al. | 375/316 |
| 7,194,379 B1 | * | 3/2007 | Chivers | 702/176 |
| 7,683,825 B2 | * | 3/2010 | Sun et al. | 342/118 |
| 2008/0169826 A1 | | 7/2008 | Bartling | |

FOREIGN PATENT DOCUMENTS

SG        138490 A1     1/2008

* cited by examiner

*Primary Examiner* — Daniel Washburn
*Assistant Examiner* — Eboni Hughes
(74) *Attorney, Agent, or Firm* — Seed IP Law Group PLLC

(57) ABSTRACT

A method detects a threshold crossing instant at which a signal crosses a threshold, by: sampling the signal at plural sampling instants spaced from one another by a sampling period; detecting consecutive first and second sampling instants at which the signal has a first signal value lower than or equal to the threshold, and the signal has a second signal value higher than the threshold, respectively; calculating a first interval indicative of a time between the threshold crossing instant and the first sampling instant; setting a reference signal having a reference amplitude representing the first interval relative to a reference scale; generating a signal with a delay depending on said reference signal; generating a threshold crossing detection signal at an instant delayed by a second interval; calibrating the reference scale of the reference amplitude so that the second interval is substantially equal to the first interval.

15 Claims, 6 Drawing Sheets

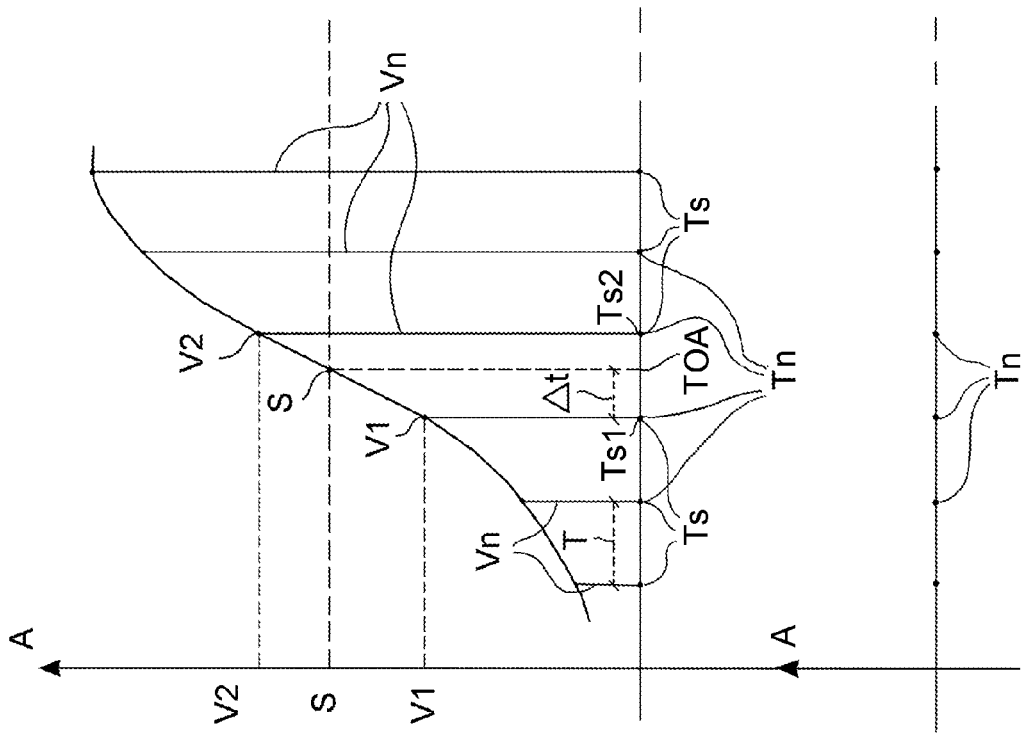

METHOD FOR DETECTING WITH A HIGH TEMPORAL ACCURACY A THRESHOLD CROSSING INSTANT BY A SIGNAL

BACKGROUND

1. Technical Field

The present disclosure relates to the detection of a threshold crossing instant by an electrical signal, by means of an electronic device. In particular, the disclosure relates to a method and a device capable of detecting, with a high temporal accuracy, a threshold crossing instant of an electrical signal converted in digital form.

2. Description of the Related Art

In several electronic systems, it is essential to detect an instant at which an electrical signal crosses a threshold level, or threshold.

The threshold crossing may be representative, in different application scopes, of different events: for example, it may be associated to a change in the digital logical level, or it may discriminate a condition of signal "absence" (off) from a condition of signal "presence" (on), or vice versa.

In particular, for an electrical signal having a monotonic leading or trailing edge, the crossing instant of a threshold may represent a "time of arrival" (TOA) or a "time of transmission" (TOT) of the signal.

Such definitions of TOA and TOT are well known in the considered technical field, especially in the context of systems for which the time of arrival or transmission of a signal is essential: this is true, for example, in reception and transmission systems for radar signals, or in localization (such as the GPS system) or synchronization systems.

It should be noted that, in such systems, it is essential for the detection to be temporally accurate, that is, it should occur in an instant having a fixed delay, known with a high accuracy and steady, relative to the instant at which the signal is physically received, for example by an analog receiver. In other words, the requirements of a system for detecting the time of arrival relate not much to the instantaneity of the detection but to the temporal accuracy thereof.

From a mathematical point of view, the time of arrival of a signal, for example step- or pulse-wise, may be defined as the instant at which the leading edge thereof crosses a threshold depending on the maximum amplitude of the signal itself, where the threshold may be defined in linear scale or in logarithmic scale. Typically, a level is chosen as a threshold whereat the time derivative of the signal is high, or even maximum, in order to facilitate the detection.

For example, it is often chosen as threshold level a level corresponding to 50% of the maximum signal amplitude, in linear notation, which in logarithmic notation corresponds to a level set at −6 dB relative to the maximum peak reached.

In the above-mentioned example, if the maximum signal amplitude is not known in advance, it is not possible to instantaneously determine the threshold crossing; in this case a sort of signal recording is required, in analog or digital form, which allows evaluating the amplitude thereof, and thus calculating the threshold (in this example corresponding to 50% of the amplitude), determining the instant at which the signal crosses such threshold and emitting a detection signal of a time of arrival, having a fixed and known delay relative to the time of arrival.

Thus, in such example, a known method for determining the time of arrival of the signal consists in detecting the signal peak (that is, the maximum amplitude reached), dividing such peak by two (that is, attenuating it by 6 dB) for generating a constant halved peak signal, and comparing such constant halved peak signal with the original signal delayed by a delay T0, at least equal to the time taken by the signal for rising from 50% to 100% of its peak level.

The first crossing between the halved peak signal and the original delayed signal takes place at 50% (that is, at −6 dB) of the peak level of the original delayed signal. A detection signal, or "trigger", of the time of arrival is generated at the instant at which such crossing takes place, wherein the trigger is synchronized with the time of arrival, with a delay equal to delay T0 imposed to the signal.

The method described above may be implemented by analog electronics. In this case, however, the detection accuracy of the time of arrival is related to noise and thermal drift features of the analog circuits that are used.

The analog detection method, actually, is less and less used, because of the accuracy limitations due to the reasons mentioned above. Moreover, the analog nature of such method does not allow having numerical results and outcomes and therefore it cannot be used in the field of digital electronics, nowadays prevailing.

For this reason, the state of the art envisages that the same functional method for determining the time of arrival, described above, is converted in a mathematical algorithm implementable through a digital circuitry, which in particular may be an FPGA (Field Programmable Gate Array) circuitry. To this end, the input signal is acquired with an analog-digital converter (ADC), and all the following process is performed through numerical calculations.

Let's thus consider said digital methods for detecting the time of arrival, or more in general, for detecting a threshold crossing instant by an electrical signal.

Due to their digital nature, said methods intrinsically exhibit a temporal discretization which limits the accuracy that may be obtained in the detection.

In fact the resolution, and thus the accuracy, with which the threshold crossing instant is determined, is subordinated to the selection of the system clock, which is actually constrained by strict design requirements for the electronic device that implements the method. Ideally, a clock operating at very high frequencies (thus with a very short clock period) would ensure a good resolution but would give rise to a circuit complexity, to signal integrity problems, to energy consumptions and to costs not compatible with realistic solutions.

On the other hand, the use of clocks with cost and complexity compatible with the scope considered (for example, having a clock period in the order of 10 ns) limits the temporal resolution of the detection of the threshold crossing instant: the order of magnitude of such resolution is comparable to the clock period. As a consequence, the detection error margin, comparable to the clock period, may be unsatisfactory for many applications, such as the already mentioned reception and transmission systems for radars or for GPS localizers.

BRIEF SUMMARY

Some embodiments of the present disclosure are a method and a device for detecting a threshold crossing instant by an electrical signal, improved in such a way as to obviate at least partly to the drawbacks mentioned above with reference to the prior art.

In particular, a method for detecting a threshold crossing instant is proposed which exhibits a high temporal accuracy, such as to make the temporal detection error much lower than the clock period of the clock of the device that implements said method.

More particularly, a method is proposed for asserting a trigger, with fast edge compared to the edge of an electrical signal, having a known delay and such an accuracy as to make it indicative of the threshold crossing instant, by the electrical signal, with an expected resolution.

One embodiment is a method according to claim 1.

Further embodiments of such method are defined in the dependent claims 2 to 11.

An electronic detection device configured for implementing the method according to the disclosure is defined in claim 12.

Further embodiments of such device are defined in the dependent claims 13 to 15.

One embodiment is s method for detecting, through an electronic detection device 1, a threshold crossing instant TOA at which an electrical signal V crosses a threshold S. Such method comprises the steps of: defining, by a clock signal CL, a sequence of discrete clock instants Tn such that two consecutive clock instants of the sequence are time spaced from one another by a clock period T; then, sampling the electrical signal V with a sampling period T equal to the clock period T, at a plurality of sampling instants Ts belonging to the sequence of clock instants Tn; then detecting a first sampling instant Ts1 and a subsequent consecutive second Ts2 sampling instant, such that at one of said first Ts1 and second sampling instant Ts2 the sampled signal value has a first signal value V1 lower than or equal to threshold S, and at the other one of said first Ts1 and second Ts2 sampling instant the sampled signal value has a second signal value V2 higher than threshold S; moreover, calculating, on the basis of the first signal value V1, the second signal value V2 and threshold S, a first time interval $\Delta t$, fractional with respect to the clock period T, indicative of a temporal distance between the threshold crossing instant TOA and the first sampling instant Ts1; then, setting a reference electrical signal VR having a reference amplitude VR representative of the first time interval $\Delta t$ relative to a reference scale; subsequently, providing the reference signal VR as an input signal of a comparison module 500, configured for generating a signal with a controlled delay depending on said input signal; then, generating a threshold crossing detection signal VTOA through the comparison module 500, at a threshold crossing detection instant TTOA delayed by a second time interval $\Delta t'$ relative to a reference instant Tr belonging to the sequence of clock instants Tn, said second time interval $\Delta t'$ depending on the reference amplitude VR; finally, calibrating the reference scale of the reference amplitude VR so that the second time interval $\Delta t'$ is substantially equal in length to the first time interval $\Delta t$.

BRIEF DESCRIPTION OF THE SEVERAL VIEWS OF THE DRAWINGS

Further features and advantages of the method and of the electronic device for detecting a threshold crossing instant, according to the disclosure, will appear more clearly from the following description of preferred exemplary embodiments thereof, given by way of a non-limiting example with reference to the annexed figures, wherein:

FIGS. 4A, 4B, 4C and 5 are temporal diagrams that show some signals during some steps of the method according to an example of the disclosure.

DETAILED DESCRIPTION

Figure 1:
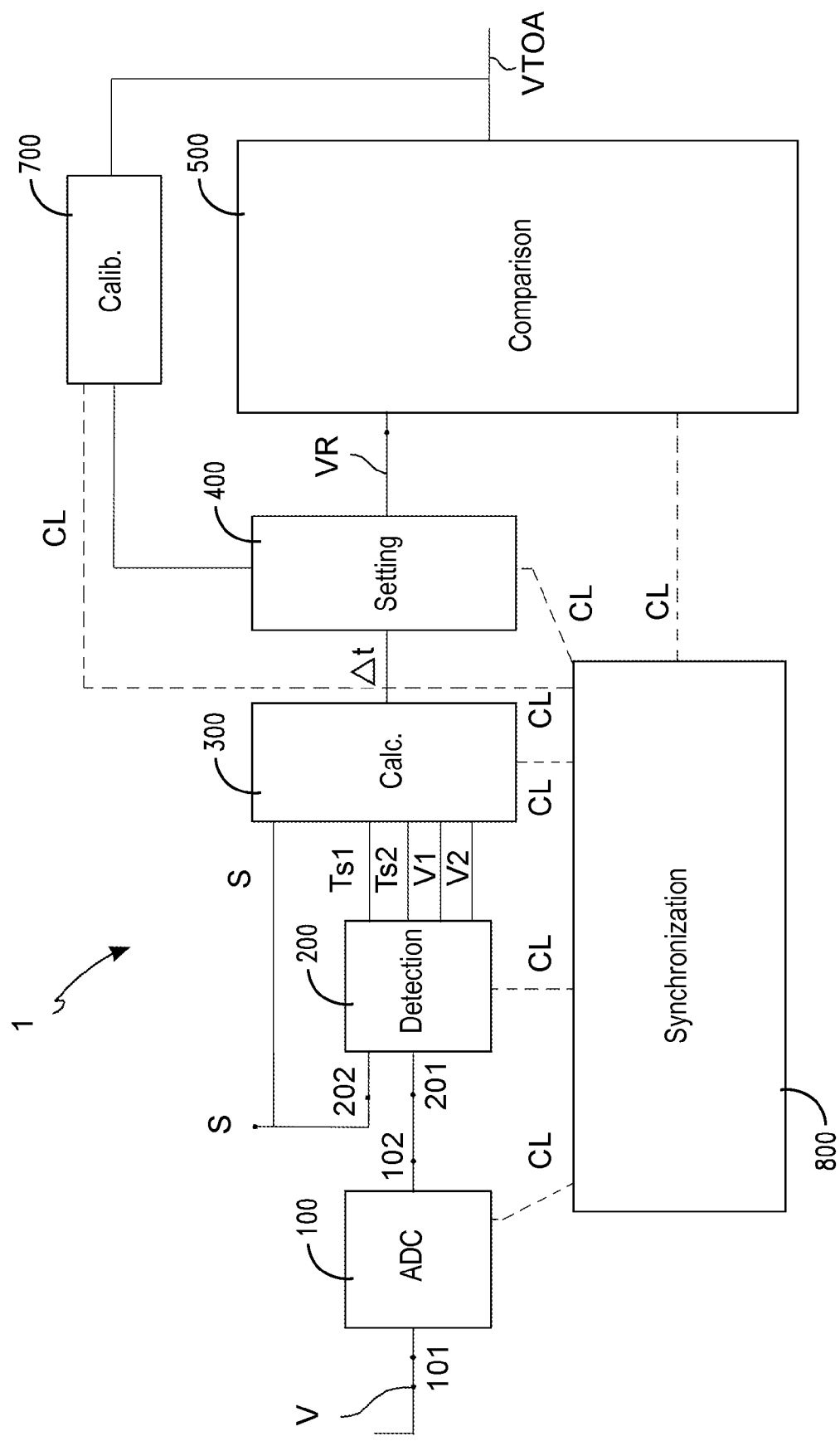
FIG. 1 shows a block diagram of a detection device according to an example of the disclosure.

With reference to FIG. 1, an electronic device 1 for detecting a threshold crossing instant TOA, at which an electrical signal V crosses a threshold S, is described, according to an example of the present disclosure.

The detection device 1 comprises an analog to digital conversion module 100 having an input 101 and an output 102.

The conversion module 100 is configured for sampling the electrical signal V, provided to input 101, with a sampling period T, and for providing a sequence of sampled signal values Vn to output 102.

It should be noted that the sampling is performed at sampling instants Ts, temporally equally spaced from one another by a sampling period T, wherein the sampling instants Ts belong to a more general sequence of clock instants Tn, defined by a clock signal CL having clock period T equal to the sampling period T.

Therefore, the sequence of sampled signal values Vn comprises a sampled signal value Vn in each one of the sampling instants Ts.

Figure 3:
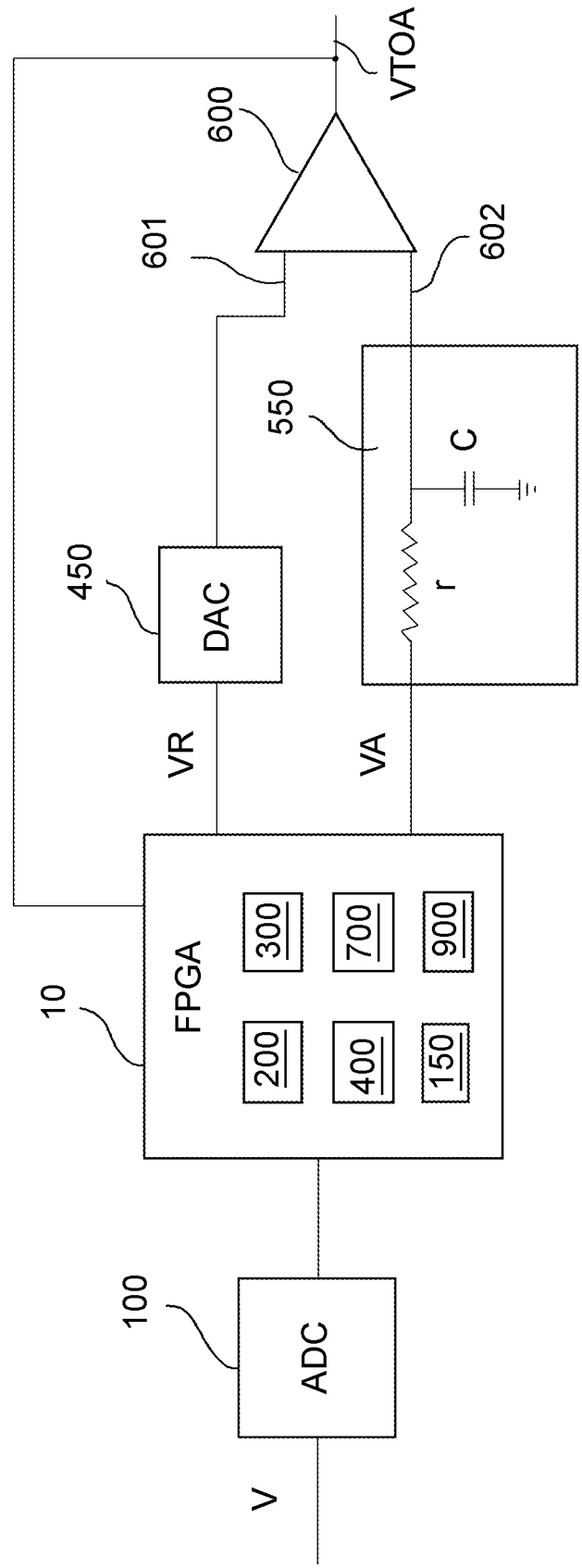
FIG. 3 shows a circuit layout of a detection device according to a further example of the disclosure.

The conversion module 100 may consist, for example, of an analog-digital converter (ADC), per se known, as shown in FIG. 3.

The clock signal CL is generated by a synchronization unit 800, comprised in the detection device 1. In particular, the synchronization unit 800 is configured for generating a clock signal CL having a clock period T equal to the sampling period T, so as to define the sequence of clock instants Tn; moreover, the synchronization unit is operatively connected to the conversion module 100 and to further modules of the device 1 that will be described hereinafter (for example, detection module 200, calculation module 300, setting module 400 and comparison module 500), for providing the clock signal CL.

The detection device 1 further comprises a detection module 200 having a first detection module input 201 operatively connected to the conversion module output 102, for receiving the sequence of sampled signal values Vn, and a second detection module input 202 for receiving a value representative of threshold S (that hereinafter will also be defined as "threshold").

The detection module 200 is configured for detecting a first sampling instant Ts1 and a subsequent consecutive second sampling instant Ts2, such that in one of said first Ts1 and second Ts2 sampling instants the sampled signal value has a first signal value V1 lower than, or equal to, threshold S, and in the other one of said first Ts1 and second sampling instants Ts1 the sampled signal value takes on a second signal value V2 higher than the threshold.

If signal V is increasing, the value V1 is the sampled signal value at instant Ts1, and the value V2 is the sampled signal value at instant Ts2; and vice versa, if signal V is decreasing.

The detection module 200 is further configured for providing in output the first signal value V1, the second signal value V2 and the threshold S.

According to an embodiment, the detection module 200 also specifies in output which are the first Ts1 and the second Ts2 sampling instants detected.

The detection module 200 may consist, for example, of a digital circuit, per se known.

Figure 4C:
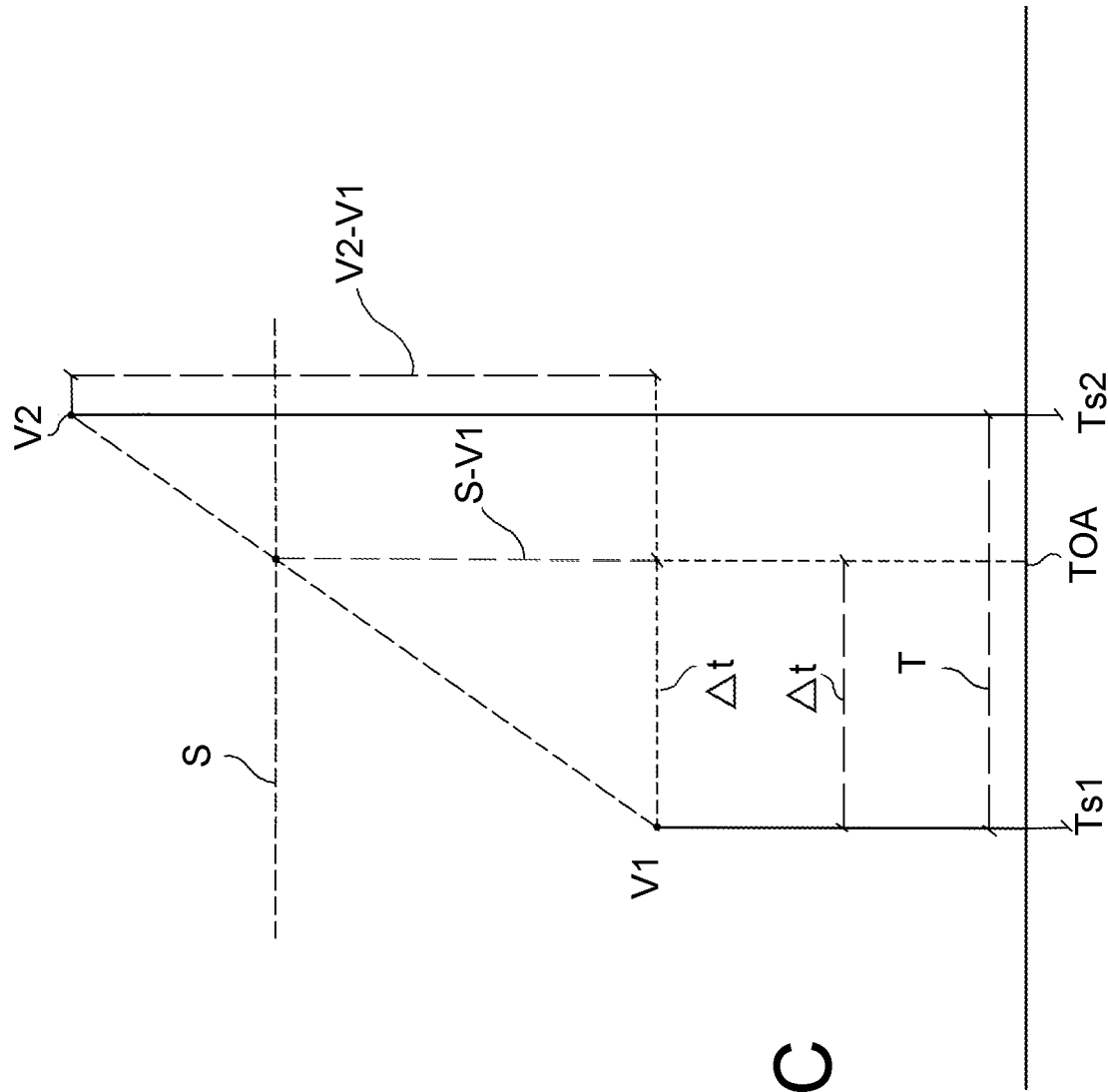

A temporal diagram exemplifying what illustrated above is shown in FIG. 4A, wherein there are shown in particular the sampled signal values Vn at the output of the detection module 200, as well as the first Ts1 and the second Ts2 sampling instants detected, and the respective first signal value V1 and second signal value V2. FIG. 4A also shows the threshold crossing instant TOA, which is to be detected, which lies necessarily between said first Ts1 and second Ts2 sampling instant.

With reference again to FIG. 1, it should be noted that device 1 further comprises a time interval calculation module 300, which is operatively connected to the detection module 200 for receiving the first signal value V1, the second signal value V2 and the threshold S.

The calculation module 300 is configured for calculating and providing in output, on the basis of the first signal value V1, the second signal value V2 and the threshold S, a value of a first time interval $\Delta t$, indicative of a temporal distance between the threshold crossing instant TOA and the first sampling instant Ts1.

For this purpose, the calculation module 300 may consist, for example, of a logical digital circuit, per se known, or it may be implemented by a processor present in device 1.

It is worth to be noticed that the first time interval $\Delta t$ is fractional with respect to the sampling period T since, as already noted, the threshold crossing instant TOA lies between the first and the second sampling instants. For this reason, such first time interval is calculated by the device 1 and is not directly detected.

It should be pointed out that, in prior art devices for detecting the time of arrival, the resolution whereof cannot be lower than the clock period thereof, the threshold crossing instant TOA would be approximated to the first Ts1 or to the second Ts2 sampling instant detected. On the contrary, in the device of the present disclosure the identification of the fractional interval $\Delta t$ is aimed at a more accurate detection, as will be further illustrated hereinafter.

As regards the calculation of $\Delta t$, it may be performed on the basis of a linear interpolation, according to an exemplary embodiment.

In such example, it is assumed that the evolution of signal V is linear or almost linear between two consecutive sampling instants; such hypothesis almost always occurs with good approximation, except for exceptional cases, also in the light of the fact that the sampling period T is sufficiently short to respect the Shannon sampling theorem. This allows to linearly extrapolate, with excellent approximation, the intermediate values between two consecutive samples, and in particular the threshold crossing instant TOA.

In the hypothesis of linear interpolation, the first time interval $\Delta t$ is calculated as proportional to the ratio between the difference between the threshold value S and the first signal value V1, and the difference between the second signal value V2 and the first signal value V1.

According to a more specific example, using symbols already described, the formula for calculating $\Delta t$ is:

$$\Delta t = T*[(S-V1)/(V1-V2)] \quad (1)$$

According to different embodiments, the calculation module 300 is configured for calculating $\Delta t$ based on other types of interpolation, or other types of function $\Delta t = f(V1, V2, S)$, wherein such function depends on an actual profile of signal V in the zone of threshold S, if different from the typical linear evolution.

According to different exemplary embodiments, the calculation module 300 is configured for performing the above calculations in linear scale or in logarithmic scale.

With reference again to FIG. 1, the detection device 1 also comprises a reference amplitude setting module 400, operatively connected to the calculation module 300 for receiving the calculated value of the first time interval $\Delta t$, and also configured for setting a reference electrical signal VR (hereinafter also defined as "reference signal VR"), having a reference amplitude VR representative of the first time interval value $\Delta t$, relative to a reference scale.

Therefore, the setting module 400 has the twofold function of transforming a first time interval value $\Delta t$ into a respective reference amplitude value VR, in biunique correspondence with one another; and thus of generating a reference electrical signal having an amplitude equal to the reference amplitude VR.

Such reference electrical signal, in the embodiments described herein, is preferably a voltage; in further embodiments, it may be another type of signal, for example a current.

According to an embodiment, the setting module 400 therefore comprises a logical digital circuit for the processing required for the transformation from $\Delta t$ to VR; and a voltage generator, per se known as well, driven by said processing circuit for generating a reference electrical signal with amplitude equal to VR.

Below, some specific examples of definition of the reference scale of the reference amplitude VR and some examples of relationship between first time interval $\Delta t$ and reference amplitude VR are shown.

As also illustrated in FIG. 1, the detection device 1 further comprises a comparison module 500, operatively connected to the setting module 400 for receiving the reference signal VR.

The comparison module 500 is configured for generating a threshold crossing detection signal VTOA, at a threshold crossing detection instant TTOA (hereinafter also defined as "detection instant TTOA"), so that the detection instant TTOA depends on the reference amplitude VR, that is, on the amplitude of the reference electrical signal VR that is received in input.

The relationship between a reference amplitude VR and the respective detection instant is known and is characteristic of the comparison module 500, so that the detection instant TTOA is delayed by a second time interval $\Delta t'$ relative to a reference instant Tr belonging to the sequence of clock instants Tn.

The comparison module 500 may consist, for example, of analog or digital circuits, or of combinations of analog and digital circuits. A preferred embodiment of the comparison module 500 will be illustrated hereinafter, while describing FIG. 2.

The reference instant Tr depends on the processing times and on the delays introduced by the elements of the processing chain of the detection device 1 (for example, the elements shown in FIG. 1). The delay of such reference instant Tr relative to the first sampling instant Ts1 is therefore known, once the structure of the device 1 has been defined.

It should be observed that, in any case, the temporal distance between Tr and the first sampling instant Ts1 is a multiple of the clock period T, thanks to the fact that instant Tr belongs to sequence Tn of clock signals, which dictates the operation of the entire system.

The threshold crossing detection instant TTOA, on the other hand, is not bound to belong to the sequence Tn, and usually it is not. As shall be better seen hereinafter, this aspect allows to release from the resolution imposed by the clock period and advantageously, to improve the temporal accuracy of the detection.

In other words, the second time interval $\Delta t'$, that is, the delay of instant TTOA relative to instant Tr, is fractional relative to the clock period T.

It should be noted that the detection device 1, as shown in FIG. 1, further comprises a calibration module 700, operatively connected to the setting module 400 on one side, and to the comparison module 500 on the other.

The calibration module 700 is configured for calibrating the reference scale of the reference amplitude VR so that the second time interval Δt' is substantially equal to the first time interval Δt.

Different ways in which such calibration is performed, in different embodiments of the device 1, will be better illustrated hereinafter. In particular, examples of correlation between the reference amplitude VR and the second time interval Δt', and examples of how to control such correlation, will be defined.

It is here noticed in advance that said calibration may be performed by an operating test of the setting module 400 and of the comparison module 500; or by means of calculations based on relationships that are predefined on the basis of the actual implementation of said modules; or on a combination of said two approaches.

In all of the above cases, the calibration module 700 may be implemented, for example, by means of a logical digital circuitry.

It should be pointed out that the calibration module 700 allows to ensure that the threshold crossing detection instant TTOA is synchronous with respect to the threshold crossing instant TOA, with a known and fixed delay. In fact, based on the above description, the following relations apply:

$$TTOA = Tr + \Delta t' \quad (2)$$

$$TOA = Ts1 + \Delta t \quad (3)$$

Moreover, thanks to the calibration module 700, Δt=Δt'. Therefore:

$$TTOA - TOA = Tr - Ts1 \quad (4)$$

As already noticed, the difference Tr−Ts1, that is, the delay between Tr and Ts1, is a multiple of the clock time, therefore it is a fixed and known delay. Thus, based on formula (4), it is concluded that also the delay of instant TTOA relative to instant TOA is fixed and known.

This achieves the objectives of the detection device. In fact, the extent of the delay elapsing between the instant at which the threshold crossing TTOA is detected and the instant TOA at which the threshold has been crossed is not a problem for a detection device, provided that such delay is known and fixed, as ensured by the device according to the disclosure.

The threshold crossing detection signal VTOA is therefore a valid indicator of the threshold crossing by the signal V, since it is synchronous with the threshold crossing instant, with a known and fixed delay.

It should be noted that, in known devices, purely digital, a detection signal of a crossing instant may change status only upon the occurrence of clock instants Tn of the system, and therefore the accuracy thereof is limited by such discretization granularity.

On the contrary, in the detection device 1, according to this disclosure, the generation of the detection signal VTOA is not bound to an instant of the sequence of clock signals Tn, but can occur at any instant, and is therefore capable of detecting the threshold crossing instant with a higher accuracy than the clock period of the device.

Figure 2:
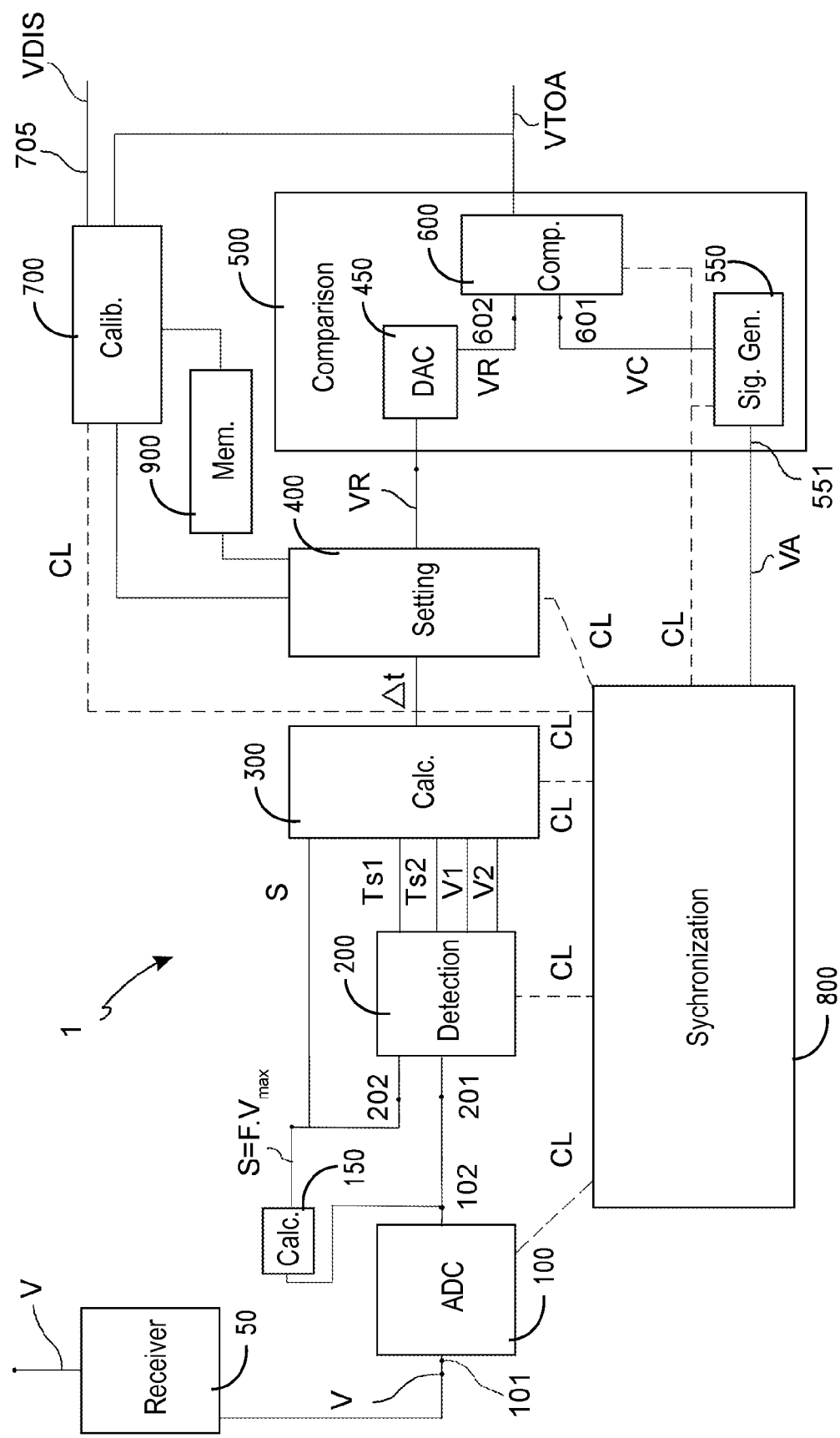
FIG. 2 shows a block diagram of a detection device according to a further example of the disclosure.

With reference now to FIG. 2, further embodiments of the device according to the disclosure will be described.

According to an exemplary embodiment, the comparison module 500 comprises a comparison signal generation circuit 550, having an input 551 provided for receiving an electrical activation signal VA at an activation instant Ta. The comparison signal generation circuit 550 is configured for generating, in response to the electrical activation signal VA, an electrical comparison signal VC, having a substantially linear evolution over time, starting from a comparison start instant Tc and during a comparison period ΔTC longer than the clock period T, so as to cover a comparison signal range ΔVC in a time period equal to the clock period T. It should be noted that such comparison signal range ΔVC must be correlated in a known manner to the reference scale of the reference amplitude VR, as will be described hereinafter.

According to an embodiment, the comparison module 500 further comprises a comparator circuit 600 having a first comparator circuit input 601 operatively connected to the comparison signal generation circuit 550 for receiving the comparison signal VC, and a second comparator circuit input 602 operatively connected to the setting module 400 for receiving the reference signal VR. The comparator circuit 600 is configured for providing a comparator output signal VTOA at a comparator output signal instant TTOA, which is synchronous, with a nominally fixed delay, relative to a crossing instant Ti at which the comparison signal VC reaches an amplitude equal to the reference electrical signal VR.

Details will be given hereinafter on how a suitable selection of said reference scale allows to make the comparator output signal VTOA to be just the threshold crossing detection signal VTOA, and the comparator output signal instant TTOA to be just the detection instant TTOA.

According to an embodiment, the setting module 400 provides a reference amplitude in digital format. In that case, the comparison module 500 further comprises a digital to analog conversion module 450, configured for converting the reference amplitude in digital format into a reference amplitude in analog format. The digital to analog conversion module 450 is operatively connected to the setting module 400, for receiving the reference amplitude VR in digital format, and to the second input of the comparator circuit 600, for providing the reference amplitude in analog format.

Figure 5:
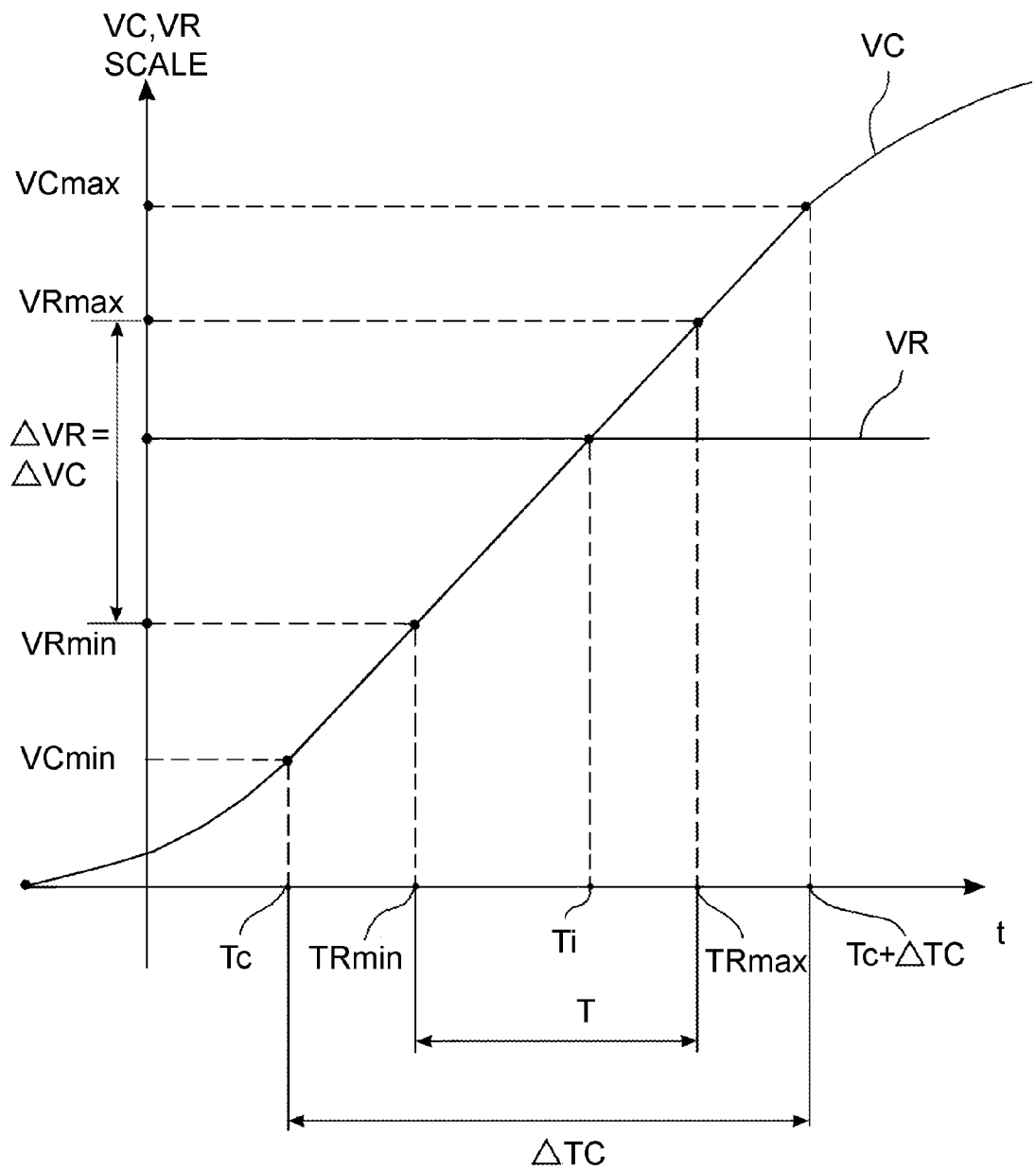

With reference now to FIG. 5, the comparison between the comparison signal VC and the reference electrical signal VR, as performed in the embodiment shown in FIG. 2, is described.

In this case, the comparator output signal VTOA is the threshold crossing detection signal VTOA, and the comparator output signal instant TTOA is the detection instant TTOA. The detection signal VTOA is emitted with a known nominal delay, typical of the comparator circuit, relative to said crossing instant between the comparison signal VC and the reference signal VR.

The comparison signal generator circuit 550, in an embodiment shown in FIG. 3, is an analog circuit 550 comprising a resistor r and a capacitor c and having a time constant rc longer than the sampling period T. In that case, the activation signal VA is typically a step voltage signal having the goal of charging the capacitor c. The charging of capacitor c, over time, at the output of the analog circuit 550, generates a voltage signal having for a first portion an almost linear evolution, which may serve as comparison signal VC.

According to an exemplary embodiment, the synchronization unit 800 is further configured for generating the activation signal VA in the activation instant Ta, and further operatively connected to input 551 of the comparison signal generator circuit 550 for providing such activation signal VA.

It should be noted that the activation signal VA, resistor r, capacity c, and thus the time constant rc of the analog circuit 550, are sized according to well known criteria, so as to obtain an almost linear rising of the comparison signal VC, for a period longer than the clock period T. In particular, as illustrated in FIG. 5, it is possible to size the comparison signal generator circuit 550 so as to determine a linear zone, with excellent approximation, starting from a comparison start instant Tc, subsequent to the activation instant Ta, and during said entire comparison period $\Delta TC$.

The comparison period $\Delta TC$ is longer than the clock period T and advantageously, is longer than two clock periods.

With reference to the embodiments of device 1 shown in FIG. 2, and to the temporal diagram of significant signals, shown in FIG. 5, the definition of the reference scale of the reference amplitude VR will now be better detailed, and in particular the relationship between the first time interval $\Delta t$ and the reference amplitude VR, and the further relationship between the reference amplitude VR and the second time interval $\Delta t'$, through the comparison signal VC.

First, it should be noted that the comparison signal VC rises linearly, in the comparison period $\Delta TC$, from a minimum comparison signal value VCmin, taken at the comparison start instant Tc, to a maximum comparison signal value VCmax, taken at instant $Tc+\Delta TC$, at the end of the comparison period.

The calibration module 700 and the setting module 400 cooperate so as to define the reference scale of the reference amplitude VR as a linear scale, on the basis of a reference amplitude range $\Delta VR$ between a minimum reference amplitude VRmin and a maximum reference amplitude VRmax, so that the following conditions occur: the crossing between the comparison signal VC and the minimum reference amplitude VRmin occurs at an instant TRmin comprised within the comparison period $\Delta TC$; the crossing between the comparison signal VC and the maximum reference amplitude VRmax occurs at an instant TRmax comprised within the comparison period $\Delta TC$; the reference amplitude range $\Delta VR$ is equal to the comparison signal range $\Delta VC$, so that the length of the time interval between TRmin and TRmax is equal to a sampling period T; for each reference amplitude value VR comprised between said values VRmin and VRmax, the crossing between the comparison signal VC and said amplitude VR occurs at a crossing instant Ti, comprised between said instants TRmin and TRmax.

It should be observed that the minimum reference amplitude VRmin is equal to, or higher than, the minimum comparison signal value VCmin; the maximum reference amplitude VRmax is equal to, or lower than, a maximum comparison signal value VCmax.

From the above, it follows that, as an important consequence, the crossing instant Ti, at which the comparison signal VC reaches an amplitude VR, comprised between VRmin and VRmax, varies within the time period T, between instants TRmin and TRmax, in a linear manner with respect to amplitude VR.

In other words, given an amplitude VR, the resulting crossing instant Ti determined by the comparison module 500 results from the following calculation (as can be seen in FIG. 5):

$$(Ti-TRmin)/T=(VR-VRmin)/\Delta VR \quad (5)$$

In fact, it is possible to make sure that, at the output, said reference instant Tr, synchronous with the clock signal sequence Tn, corresponds to the instant TRmin, where instant Tr has a delay, with respect to instant TRmin, simply equal to the fixed processing delay of the comparator circuit 600. Since the detection instant TTOA (at the output of the comparator circuit 600) corresponds to the crossing instant Ti, with a delay equal to the same fixed processing delay of the comparator circuit 600, formula (5) can be reflected in a similar formula for the detection instant and the second time interval $\Delta t'$:

$$\Delta t'/T=(TTOA-Tr)/T=(VR-VRmin)/\Delta VR \quad (6)$$

At this point, it is possible to complete the chain of relationships by defining the relationship between the first time interval $\Delta t$ and the reference amplitude VR.

The reference amplitude VR is calculated, on the basis of the time interval $\Delta t$, so that the ratio between a reference difference, between the reference amplitude VR and the minimum reference amplitude VRmin, and the reference amplitude range $\Delta VR$ is substantially equal to the ratio between the first time interval $\Delta t$ and the clock period T.

In particular, according to an exemplary embodiment, the following formula applies:

$$(VR-VRmin)/\Delta VR=\Delta t/T \quad (7)$$

It can be easily seen, by combining formulae (6) and (7), that the relationship $\Delta t=\Delta t'$ is valid in this embodiment too.

In different embodiments of the disclosure, in the presence of different implementations of the comparison module 500, other calculation formulae, different from formulae (5), (6), (7) given above, may be used for defining the relations between the mentioned quantities, provided it is ensured that the second time interval $\Delta t'$ is nominally equal to the first time interval $\Delta t$.

According to an exemplary embodiment, the calculation for determining the reference amplitude VR, corresponding to the above formula (7), is performed by the calibration module 700.

According to a further exemplary embodiment, the calculation for determining the reference amplitude VR, corresponding to the above formula (7), is performed by the setting module 400.

According to a further embodiment, the detection device 1 further comprises a memory unit 900 provided for storing a correspondence table, comprising a pair of correspondence fields for each one of a plurality of time intervals $\Delta t$; such pair of correspondence fields comprises a first field containing a respective time interval value $\Delta t$ and a second field containing a corresponding reference amplitude VR calculated, for example, on the basis of formula (7).

In this case, the calibration module 700 is further configured for calculating a reference amplitude for each of the reference amplitudes VR of the correspondence table, for example by formula (7). The calibration module 700 is also operatively connected to the memory unit 900 for storing such calculated reference amplitudes to the correspondence table of the memory unit.

Finally, the memory unit 900 is operatively connected to the setting module 400 for receiving a time interval value $\Delta t$ there from and for providing, in response thereto, the corresponding reference amplitude VR, stored in the second field of the pair of correspondence fields which contains said received time interval value ($\Delta t$) in the first field. In this way, the setting module 400 can set the correct reference amplitude VR.

A similar use of the memory unit 900 may of course be provided when the mathematical relationship between quantities $\Delta t$ and VR differs from formula (7), being for example a non linear relation.

It should be noted that, in the embodiment described above, a discretization of the detectable threshold crossing instants has been introduced again. However, such discretization may have a much finer granularity than that of the clock period T. In fact, the correspondence table provides for N pairs of correspondence fields (where N may be any number, for example typically, 100) and this implies that a single clock period T contains N sub-periods that define the fine granularity with which the first time interval $\Delta t$ can be detected.

In other words, the accuracy, with which the threshold crossing instant can be detected, increases by a factor N (for example 100, that is, two orders of magnitude) relative to the clock period T.

With reference now again to FIG. 2, a further embodiment of the detection device 1 is described, employed for example if the electrical signal V is a pulse or step signal, rising or descending, having a leading or trailing edge substantially monotonic, and further having a peak value Vmax; and wherein the threshold S is correlated to the peak value (Vmax) by a multiplicative parameter f comprised between 0 and 1. Typically, such multiplicative parameter takes a value 0.5, which corresponds to the case in which the threshold is defined as 50% of the peak value Vmax.

In such embodiment, the detection device 1 further comprises a reception module 50 of the electrical signal V, operatively connected to the conversion module 100, for providing the electrical signal V.

Moreover, the detection device 1 comprises a threshold calculation module 150, operatively connected to the conversion module 100 for receiving the sampled electrical signal in digital format, provided at output 102, and configured for detecting the peak value Vmax and for attenuating such peak value by the multiplicative parameter f, so as to obtain a threshold value S. The threshold calculation module 150 is also operatively connected to input 202 of the detection module 200 for providing the calculated threshold value S.

The threshold calculation module 150 is further configured for introducing an initial delay T0, on the electrical signal sampled, so as to provide the threshold level S before a comparison with the sampled signal values Vn, by the detection module 200. For this purpose, the threshold calculation module 150 for example comprises a digital delay module (not shown in FIG. 2).

According to a different exemplary embodiment, the initial delay T0 may be introduced by the reception module 50, on the electrical signal V in analog format.

According to a further exemplary embodiment, the peak value Vmax and the calculation of the threshold value S are performed by the reception module 50, on the electrical signal V in analog format. In this case, the threshold calculation module 150 is not provided and the reception module 50 is operatively connected to the detection module 200 for providing the threshold value S.

It should be pointed out that, in an embodiment of the detection device 1, the threshold calculation module 150, the detection module 200, the calculation module 300, the setting module 400, the calibration module 700 and the memory unit 900 are comprised in a processing module 10 of the detection device 1 (shown in FIG. 3).

According to a further exemplary embodiment, the processing module 10 consists of an FPGA (Field Programmable Gate Array) digital circuitry. In this case, the partition of the FPGA digital circuitry may also differ from the functional partition of device 1, but generally carrying out the same functions.

Other functional blocks of the detection device 1 contain analog parts, consisting of analog circuits: for example, these are the comparison signal generation circuit 550 and the comparator circuit 600.

Possibly, the features of such analog parts sometimes have such tolerances as to at least partly reduce the temporal accuracy of the detection. Moreover, some of such features depend on temperature and may slowly vary over time.

To obviate these possible drawbacks, in a further embodiment of the detection device 1 the calibration module 700 is further configured for performing the following further calibration operations: providing a sequence of test reference electrical signals to the comparison module 500; then, determining a minimum test reference signal amplitude for which the comparison module 500 generates the threshold crossing detection signal TTOA synchronized with the reference instant Tr; then, determining a maximum test reference signal amplitude for which the comparison module 500 generates the threshold crossing detection signal VTOA with a delay equal to the clock period T relative to the reference instant Tr; finally, defining the reference scale of the reference amplitude VR on the basis of said maximum test reference signal amplitude and minimum test reference signal amplitude.

For example, the reference scale may be defined as a linear scale having said minimum test reference signal amplitude as minimum reference amplitude VRmin; and said maximum test reference signal amplitude as maximum reference amplitude VRmax. Once defined the minimum VRmin and maximum VRmax reference amplitudes, and thus also the reference amplitude range $\Delta$VR, it is possible to calculate the relationships referred to the other reference amplitudes VR, for example using formulae (6) and (7).

According to a further embodiment, the correspondence table of the memory unit 900 is updated, based on the sequence of further calibration operations described above: in particular, the reference amplitude VRmin, corresponding to $\Delta t=0$, and the reference amplitude VRmax, corresponding to $\Delta t=T$ are updated; and the reference amplitudes corresponding to the other values of first time interval $\Delta t$ comprised in the table are calculated, for example through linear interpolation according to formula (7).

With reference to FIG. 5, it should be noted that the above calibration allows to move the interval of amplitudes from VRmin to VRmax, within the wider interval from VCmin to VCmax; and consequently this allows to move the time period T, between instants TRmin and TRmax, within the wider comparison time period $\Delta$TC, so that the detection instant TTOA, for which $\Delta t$ is equal to 0, remains linked to the reference instant Tr.

According to an embodiment, the sequence of further calibration operations is carried out periodically, in different periods than the normal operating periods of the detection device 1. Advantageously, the periodicity of such sequences is shorter than the average stability time of the analog parameters of device 1, the fluctuations whereof are to be compensated, so that such fluctuations never impair the detection accuracy.

In the above-mentioned embodiment, the calibration module 700 comprises a disabling output 705, and is configured for providing a disabling signal VDIS through such disabling output 705 to an electrical circuit, arranged downstream of device 1, which uses the detection signal VTOA. Such disabling signal VDIS is activated during the periods in which said sequence of further calibration operations is performed, during which the detection device does not perform the standard detection operations.

It should be noted that said sequence of further calibration operations mainly aims at obviating drifts of age and temperature the passive analog components of device 1 may optionally be subject to; and moreover it allows to check that the comparison signal generation circuit 550 continues to operate in linear zone, and exhibits no excessive variations due to possible deteriorations or breakage.

The method for detecting a threshold crossing instant according to the present disclosure will be described hereinafter. In particular, various exemplary embodiments, corresponding to the embodiments already described with reference to the device according to the disclosure, will be summarized.

According to a first embodiment, the disclosure comprises a method for detecting, through an electronic detection device 1, a threshold crossing instant TOA at which an electrical signal V crosses a threshold S, comprising the following steps: defining a sequence of discrete clock instants Tn by a clock signal CL, such that two consecutive clock instants of the sequence are spaced in time from one another by a clock period T; then, sampling the electrical signal V with a sampling period T equal to the clock period T, in a plurality of sampling instants Ts belonging to the sequence of clock instants Tn; then detecting a first sampling instant Ts1 and a subsequent consecutive second sampling instant Ts2, such that at one of said first Ts1 and second Ts2 sampling instant the sampled signal value has a first signal value V1 lower than, or equal to, threshold S, and at the other one of said first Ts1 and second Ts2 sampling instant the sampled signal value has a second signal value V2 higher than threshold S; moreover, calculating, on the basis of the first signal value V1, of the second signal value V2 and of threshold S, a first time interval Δt, fractional with respect to the clock period T, indicative of a temporal distance between the threshold crossing instant TOA and the first sampling instant Ts1; then, setting a reference electrical signal VR having a reference amplitude VR representative of the first time interval Δt relative to a reference scale; subsequently, providing the reference signal VR as an input signal of a comparison module 500, configured for generating a signal with a controlled delay depending on said input signal; then, generating a threshold crossing detection signal VTOA by means of the comparison module 500, at a threshold crossing detection instant TTOA delayed by a second time interval Δt' relative to a reference instant Tr belonging to the sequence of clock instants Tn, said second time interval Δt' depending on the reference amplitude VR; finally, calibrating the reference scale of the reference amplitude VR so that said second time interval Δt' is substantially equal in length to said first time interval Δt.

According to a second embodiment, the method provides that the step of calibrating further comprises the following steps: firstly, providing a sequence of test reference electrical signals to the module with controlled delay 500; then, determining a minimum test reference signal amplitude for which the comparison module 500 generates the threshold crossing detection signal TTOA synchronized with the reference instant Tr; likewise, determining a maximum test reference signal amplitude for which the module with controlled delay 500 generates the threshold crossing detection signal TTOA with a delay equal to the clock period T relative to the reference instant Tr; finally, defining the reference scale of the reference amplitude VR on the basis of said maximum amplitude and minimum amplitude of test reference.

According to a third embodiment, the method provides that the step of calibrating further comprises, on the contrary, the following steps: defining the reference scale of the reference amplitude VR on the basis of a reference amplitude range ΔVR between a minimum reference amplitude VRmin and a maximum reference amplitude VRmax; then, calculating the reference amplitude VR, depending on the time interval Δt, so that the reference amplitude VR and the minimum reference amplitude VRmin define a reference difference such that the ratio between said reference difference and the reference amplitude range ΔVR is substantially equal to the ratio between the first time interval Δt and the clock period T. According to such embodiment, moreover, the comparison module 500 is configured for generating the threshold crossing detection signal VTOA with a delay linearly depending on the reference amplitude VR. It should be noted that, in this embodiment of the method, the above illustrated formula (7) is used.

A further embodiment of the method according to the disclosure comprises the steps of both the second and the third embodiment mentioned above. In that case, the minimum reference amplitude VRmin is equal to the minimum test reference signal amplitude; the maximum reference amplitude VRmax is equal to the maximum test reference signal amplitude; the reference scale of the reference amplitude is a linear scale comprised between the minimum reference amplitude VRmin and the maximum reference amplitude VRmax; the calculation of the reference amplitude VR depending on the first time interval Δt is performed on the basis of formula (7).

According to a further embodiment, the method according to the disclosure provides that the step of calculating the reference amplitude comprises calculating a plurality of reference amplitudes VR, each corresponding to one of a plurality of first time intervals Δt, so that each reference amplitude VR and the minimum reference amplitude VRmin define a respective reference difference such that the ratio between each reference difference and the reference amplitude range ΔVR is substantially equal to the ratio between the respective first time interval Δt and the sampling period T. It should be observed that the above calculations are performed, also in this case, on the basis of formula (7).

According to an embodiment, the method further provides for setting up, in a memory unit 900 of the electronic detection device 1, a correspondence table comprising a pair of correspondence fields for each one of said plurality of first time intervals Δt; such pair of correspondence fields comprises a first field, containing a respective first time interval value Δt, and a second field, containing the corresponding calculated reference amplitude VR; and finally, the method provides for looking through the correspondence table, by a setting module 400 of the electronic detection device 1, for determining, given a first time interval value Δt, the corresponding reference amplitude VR.

In a further embodiment, the method comprises storing reference amplitudes, calculated on the basis of formula (7), in the correspondence table and then periodically updating such amplitudes, after the periodical execution of the steps provided in the second embodiment of the method described above.

According to a further embodiment, the method provides that the step of calculating a first time interval Δt comprises the further steps of calculating a first difference between the threshold value S and the first signal value V1; further calculating a second difference between the second signal value V2 and the first signal value V1; finally, calculating a ratio between said first difference and said second difference, and multiplying such ratio by the clock period T, for obtaining the first time interval Δt. It should be noted that in such embodiment of the method, formula (1) shown above is used.

According to an even further embodiment, the method provides that the step of generating a threshold crossing detection signal VTOA comprises the steps of: generating, by means of the comparison module 500, an electrical comparison signal VC, having a substantially linear evolution over time, starting from a comparison start instant Tc and during a comparison period ΔTC longer than the clock period T, so as to cover a comparison signal range ΔVC in a period equal to the clock period T (it should be noted that such comparison signal range ΔVC is correlated to the reference scale of the reference amplitude VR); then, performing a comparison between the reference amplitude VR and the electrical comparison signal VC; finally, generating the threshold crossing detection signal VTOA on the basis of said comparison.

According to a particular exemplary embodiment, the correlation between said reference scale of the reference amplitude VR and the comparison signal VC provides that the reference amplitude range ΔVR is equal to the comparison signal range ΔVC; and also provides that the minimum reference amplitude VRmin is equal to or higher than a minimum comparison signal value VCmin, taken by the comparison signal VC during the comparison period ΔTC, and that the maximum reference amplitude VRmax is equal to or lower than a maximum comparison signal value VCmax, taken by the comparison signal VC during the comparison period ΔTC.

According to a further exemplary embodiment, the method provides that the step of generating an electrical comparison signal VC further comprises the steps of: providing a comparison signal generation circuit 550, configured for generating the electrical comparison signal VC, in response to an electrical activation signal VA, provided to an input 551 of the comparison signal generation circuit 550, at an activation instant Ta prior to the comparison start instant Tc; then, providing the electrical activation signal VA to the input 551 of the comparison signal generation circuit 550 at the activation instant Ta, so as to generate the electrical comparison signal VC at the output of the comparison signal generation circuit 550.

According to an exemplary embodiment, the method provides that the step of performing a comparison comprises the further steps of: providing a comparator circuit 600 of the comparison module 500; then, providing the comparison signal VC to a first input 601 of the comparator circuit 600 and providing the electrical reference signal VR to a second input 602 of the comparator circuit 600. In such exemplary embodiment, the step of generating the detection signal comprises: generating the threshold crossing detection signal VTOA, by the comparator circuit 600, at a detection instant TTOA delayed by a nominally fixed delay relative to a crossing instant Ti at which the comparison signal VC reaches an amplitude equal to the amplitude of the reference electrical signal VR.

It should be noted that the relationships between the quantities involved in such exemplary embodiment are represented by the above described formulae (6) and (7).

According to an even further embodiment, the method provides that the electrical signal V is a pulse or step signal, rising or descending, having a leading or trailing edge substantially monotonic, and further having a peak value Vmax; and that the threshold S is correlated to the peak value Vmax by a multiplicative parameter f comprised between 0 and 1.

In that case, the detection step further comprises detecting the peak value Vmax of the electrical signal V; then, attenuating the peak value Vmax by the multiplicative parameter f for obtaining a threshold level corresponding to threshold S; then, introducing an initial delay TI on the electrical signal V, so as to provide the threshold level before a comparison with the sampled signal values Vn; finally, comparing each of the sampled signal values Vn with the threshold level.

As can be noticed, the object of the present disclosure is achieved by the detection device 1 and by the detection method described above, by virtue of their features.

In fact, the method for detecting a threshold crossing instant of the present disclosure allows a high temporal accuracy, such as to make the temporal detection error much lower than the clock period of the clock of the device that implements the method.

This occurs thanks to the combination of the features given in claim 1: a detection instant comprised between two clock signals can be detected by means of calculation; a temporal value corresponding to such detection instant is transformed, through a suitable relationship, in an electrical variable, which is in turn transformed, through a further relationship, in a temporal variable that allows to generate a detection signal in turn comprised between two clock signals.

The threshold crossing instant and the threshold crossing detection instant can thus be different from instants belonging to the clock instant sequence, therefore providing a release from the resolution limits imposed by the clock.

Moreover, the threshold crossing instant and the threshold crossing detection instant are made synchronous, that is, time spaced by a delay which is known, fixed and multiple of a clock period, by means of a suitable calibration, as described.

It should be noted that the application of such method actually allows to ensure an improvement in accuracy compared to the clock resolution, which typically is of at least one order of magnitude, and can go up to two orders of magnitude, if the electrical input signal is particularly steady.

Let's consider the following typical context of use.

The present disclosure is particularly useful within the context of systems for which the time of arrival or transmission of a signal is essential, while keeping limited complexity and costs: this happens, for example, in reception and transmission systems for radar signals, and in localization (such as GPS) or synchronization systems. In fact, in such systems, the quantity representing the relevant information is just the time of arrival TOA or of transmission TOT of a signal.

In the mentioned systems, a temporal detection accuracy in the order of 1 ns or, preferably, of a fraction of ns, may be required.

A conventional digital detection device, having resolution equal to the clock period, should therefore include a clock having a clock period of 1 ns or even 0.1 ns. However, this would entail costs and complexity that sometimes are not compatible with this type of devices.

Thanks to the method of the present disclosure, as said, the detection device is capable of ensuring an accuracy that can be from one to two orders of magnitude better than the clock resolution.

The device can thus achieve, for example, accuracies of 0.7-0.8 ns, typically, and in some cases up to 0.1 ns, having a clock with clock period of 10 ns, which is perfectly compatible with medium-low complexity and cost clocks.

A man skilled in the art may make several changes, adjustments and replacements of elements with other functionally equivalent ones to the embodiments of the detection method and of the detection system described above, also jointly with the prior art, creating hybrid implementations, in order to meet incidental needs, without departing from the scope of the following claims. Each of the features described as belonging to a possible embodiment can be obtained independently of the other embodiments described.

It should be also noted that the term "comprising" does not exclude other elements or steps, the term "a" or "an" does not exclude a plurality. The figures are not necessarily in scale, because importance is usually given to the illustration of the principles of the disclosure.

The invention claimed is:

1. A method for detecting, through an electronic detection device, a threshold crossing instant at which an electrical signal crosses a threshold, comprising:

defining by a clock signal a sequence of discrete clock instants, such that two consecutive clock instants of said sequence are spaced in time from one another by a clock period;

sampling the electrical signal with a sampling period equal to the clock period, at a plurality of sampling instants belonging to said sequence of clock instants;

detecting a first sampling instant and a subsequent consecutive second sampling instant, such that in one of said first and second sampling instants the sampled signal value has a first signal value lower than, or equal to, the threshold, and in the other one of said first and second sampling instants the sampled signal value has a second signal value higher than the threshold;

calculating, on the basis of said first signal value, second signal value and threshold, a first time interval, indicative of a temporal distance between the threshold crossing instant and the first sampling instant;

setting a reference electrical signal having a reference amplitude representative of the first time interval relative to a reference scale;

providing the reference electrical signal to the input of a comparison module comprised in the electronic detection device;

generating, by the comparison module, a threshold crossing detection signal at a threshold crossing detection instant delayed by a second time interval relative to a reference instant belonging to the clock instant sequence, said second time interval depending on the reference amplitude;

calibrating the reference scale of the reference amplitude in such a way that said second time interval is substantially equal in length to said first time interval.

2. A method according to claim 1 wherein the step of calculating a first time interval comprises:

calculating a first difference between the threshold value and the first signal value;

calculating a second difference between the second signal value and the first signal value;

calculating a ratio between said first difference and said second difference, and multiplying said ratio by the clock period, for obtaining said first time interval.

3. A method according to claim 1, wherein the step of calibrating comprises:

providing a sequence of test reference electrical signals to the comparison module;

determining a minimum test reference signal amplitude for which the comparison module generates the threshold crossing detection signal synchronized with the reference instant;

determining a maximum test reference test signal amplitude for which the comparison module generates the threshold crossing detection signal with a delay equal to the clock period relative to said reference instant;

defining the reference scale of the reference amplitude on the basis of said maximum test reference signal amplitude and minimum test reference signal amplitude.

4. A method according to claim 1, wherein the step of calibrating comprises:

defining the reference scale of the reference amplitude on the basis of a reference amplitude range between a minimum reference amplitude and a maximum reference amplitude;

calculating the reference amplitude, depending on the first time interval, so that the reference amplitude and the minimum reference amplitude define a reference difference such that the ratio between said reference difference and the reference amplitude range is substantially equal to the ratio between the first time interval and the clock period;

and wherein the comparison module is configured to generate the threshold crossing detection signal with a delay linearly depending on the reference amplitude.

5. A method according to claim 4, wherein the reference scale of the reference amplitude is a linear scale comprised between the minimum reference amplitude and the maximum reference amplitude.

6. A method according to claim 4 wherein the step of generating a threshold crossing detection signal comprises:

generating, by the comparison module, an electrical comparison signal, having a substantially linear evolution over time, starting from a comparison start instant and during a comparison period longer than the clock period, so as to cover a comparison signal range in a period equal to the clock period, said comparison signal range having a correlation with said reference scale of the reference amplitude;

performing a comparison between the reference signal and the electrical comparison signal;

generating the threshold crossing detection signal on the basis of said comparison.

7. A method according to claim 6, wherein the reference amplitude range is equal to the comparison signal range; the minimum reference amplitude is equal to, or higher than, a minimum comparison signal value taken by the comparison signal during the comparison period; and the maximum reference amplitude is equal to, or lower than, a maximum comparison signal value taken by the comparison signal during the comparison period.

8. A method according to claim 6 wherein the step of generating an electrical comparison signal comprises:

providing a comparison signal generation circuit of the comparison module, configured to generate the electrical comparison signal, in response to an electrical activation signal, provided to an input of the comparison signal generation circuit, at an activation instant prior to said comparison start instant;

providing the electrical activation signal to the input of the comparison signal generation circuit at the activation instant, so as to generate the electrical comparison signal at the output of the comparison signal generation circuit;

and wherein the step of performing a comparison comprises:

providing a comparator circuit of the comparison module;

providing the comparison signal to a first input of the comparator circuit;

providing the reference electrical signal to a second input of the comparator circuit;

and wherein the step of generating the detection signal comprises:

generating the threshold crossing detection signal, by the comparator circuit at a detection instant delayed by a nominally fixed delay relative to a crossing instant at which the comparison signal reaches an amplitude equal to the amplitude of the reference electrical signal.

9. A method according to claim 4, wherein the step of calculating the reference amplitude comprises:

calculating a plurality of reference amplitudes, each corresponding to one of a plurality of first time intervals, so that each reference amplitude and the minimum reference amplitude define a respective reference difference such that the ratio between each reference difference and the reference amplitude range is substantially equal to the ratio between the respective first time interval and the sampling period;

setting up, in a memory unit of the electronic detection device, a correspondence table comprising a pair of correspondence fields for each of said plurality of first time intervals, said pair of fields comprising a first field containing a respective first time interval value and a second field containing the corresponding reference amplitude calculated;

looking through said correspondence table, by a setting module of the electronic detection device, for determining the reference amplitude, on the basis of the first time interval.

10. A method according to claim 1, wherein:

the electrical signal is a pulse or step signal, rising or descending, having a leading or trailing edge substantially monotonic, and further having a peak value;

the threshold is correlated to the peak value by a multiplicative parameter comprised between 0 and 1.

11. A method according to claim 10, wherein the detecting step further comprises:

detecting the peak value of the electrical signal;

attenuating the peak value by the multiplicative parameter for obtaining a threshold level corresponding to the threshold;

introducing an initial delay on the electrical signal, so as to provide said threshold level before a comparison with the sampled signal values;

comparing each of the sampled signal values with said threshold level.

12. A device for detecting a threshold crossing instant at which an electrical signal crosses a threshold, comprising:

an analog to digital conversion module configured to sample the electrical signal with a sampling period, at sampling instants belonging to a clock instant sequence, and for providing a sequence of sampled signal values, comprising a sampled signal value in each of said sampling instants, to a conversion module output;

a detection module having a first detection module input operatively connected to said conversion module output for receiving said sequence of sampled signal values, and a second detection module input for receiving the threshold; said detection module being configured to detect a first sampling instant and a subsequent consecutive second sampling instant, such that at one of said first and second sampling instants the sampled signal value has a first signal value lower than, or equal to, the threshold, and at the other one of said first and second sampling instant the sampled signal value has a second signal value higher than the threshold; said detection module being further configured to output said first signal value, second signal value and threshold;

a time interval calculation module operatively connected to said detection module for receiving said first signal value, second signal value and threshold; said calculation module being configured to calculate and provide as output, on the basis of said first signal value, second signal value and threshold, a first time interval value, indicative of a temporal distance between the threshold crossing instant and the first sampling instant;

a reference electrical signal setting module, operatively connected to said calculation module for receiving said first time interval value; said setting module being configured to set a reference electrical signal having a reference amplitude representative of the first time interval value relative to a reference scale;

a comparison module, operatively connected to said setting module for receiving said reference electrical signal; said conversion module being configured to generate a threshold crossing detection signal at a threshold crossing detection instant delayed by a second time interval relative to a reference instant belonging to the clock instant sequence, said second time interval depending on the reference amplitude;

a calibration module, operatively connected to said setting module and conversion module; said calibration module being configured to calibrate the reference scale of the reference amplitude so that the second time interval is substantially equal to said first time interval;

a synchronization unit configured to generate a clock signal having a clock period equal to the sampling period, so as to define the sequence of clock instants; said synchronization unit being operatively connected to said conversion module, detection module, calculation module, setting module and comparison module for providing the clock signal.

13. A device according to claim 12, wherein the comparison module comprises:

a comparison signal generation circuit, having an input provided for receiving an electrical activation signal at an activation instant; said comparison signal generation circuit being configured to generate, in response to the electrical activation signal, an electrical comparison signal, having a substantially linear evolution over time, starting from a comparison start instant and during a comparison period longer than the clock period, so as to cover a comparison signal range in a time period equal to the clock period, said comparison signal range having a correlation with said reference scale of the reference amplitude;

a comparator circuit having a first comparator circuit input operatively connected to the comparison signal generation circuit for receiving the comparison signal, and a second comparator circuit input operatively connected to the setting module for receiving the electrical reference signal; said comparator circuit being configured to provide a comparator output signal at a comparator output signal instant synchronous, with a nominally fixed delay, relative to a crossing instant at which the comparison signal reaches an amplitude equal to the amplitude of the electrical reference signal.

14. A device according to claim 12, further comprising a memory unit provided for storing a correspondence table, comprising a pair of correspondence fields for each of a plurality of time intervals, said pair of fields comprising a first field containing a respective time interval value and a second field containing a corresponding calculated reference amplitude;

the memory unit being operatively connected to the setting module for receiving a time interval value and for providing the corresponding reference amplitude, stored in the second field of the pair of fields containing said received time interval value in the first field;

and wherein the calibration module is further configured to calculate an updated reference amplitude for each of the reference amplitudes of the correspondence table, and is operatively connected to the memory unit for storing said updated reference amplitudes into the correspondence table of the memory unit.

15. A device according to claim 12, further comprising a threshold calculation module, configured to detect a peak value of the electrical signal and for attenuating said peak value by a multiplicative parameter, so as to obtain a threshold value; said threshold calculation module being operatively connected to the conversion module for receiving the sequence of sampled signal values of the electrical signal, and to the detection module for providing the threshold value.

* * * * *